United States Patent [19]

Davis et al.

[11] 4,056,730
[45] Nov. 1, 1977

[54] APPARATUS FOR DETECTING REGISTRATION MARKS ON A TARGET SUCH AS A SEMICONDUCTOR WAFER

[75] Inventors: Donald E. Davis, Wappingers Falls, N.Y.; Millard A. Habegger, Boulder, Colo.; Hannon S. Yourke, Poughkeepsie, N.Y.

[73] Assignee: International Business Machines Corporation, Armonk, N.Y.

[21] Appl. No.: 731,270

[22] Filed: Oct. 12, 1976

Related U.S. Application Data

[63] Continuation-in-part of Ser. No. 704,605, July 12, 1976, abandoned.

[51] Int. Cl.² ............................................. H01J 37/00
[52] U.S. Cl. ............................ 250/492 R; 250/492 A
[58] Field of Search ....................... 250/492 A, 492 R; 219/121 EB; 148/1.5

[56] References Cited

U.S. PATENT DOCUMENTS

| 3,875,415 | 4/1975 | Woodard | 250/492 A |
|---|---|---|---|
| 3,901,814 | 8/1975 | Davis | 250/492 A |

Primary Examiner—Craig E. Church
Attorney, Agent, or Firm—Edward S. Gershuny

[57] ABSTRACT

A square shaped beam of charged particles is passed over a registration mark in the surface of a semiconductor wafer. A signal produced by a diode detector that is responsive to backscattered electrons will peak when the beam passes over each of the edges of the registration mark. The signal is differentiated; and the resultant signal is filtered and amplified to provide information regarding the position of the beam with respect to the wafer. If more than one diode detector is used, the signals are added just before or just after the differentiation.

7 Claims, 6 Drawing Figures

APPARATUS FOR DETECTING REGISTRATION MARKS ON A TARGET SUCH AS A SEMICONDUCTOR WAFER

This application is a continuation-in-part of application Ser. No. 704,605 filed July 12, 1976 for APPARATUS FOR DETECTING REGISTRATION MARKS ON A TARGET SUCH AS A SEMICONDUCTOR WAFER, now abandoned.

DETAILED DESCRIPTION

Background of the Invention

This invention relates to an electron beam system wherein it is necessary to locate a wafer with respect to the beam position in order to overlay a pattern onto a pattern already on the wafer. More particularly, the invention relates to improved apparatus for processing raw data signals that are related to position and for deriving further data signals that may be used to control the beam.

The following patents and application, all assigned to International Business Machines Corporation, provide background information, and all are incorporated herein. U.S. Pat. No. 3,644,700 for "Method And Apparatus For Controlling An Electron Beam" by R. W. Kruppa.

U.S. Pat. No. 3,866,013 for "Method And Apparatus For Controlling Movable Means Such As An Electron Beam" by P. M. Ryan.

U.S. Pat. No. 3,875,415, for "Method And Apparatus For Detecting A Registration Mark On A Target Such As A Semiconductor Wafer" by O. C. Woodard.

U.S. Pat. No. 3,901,814 for "Method And Apparatus For Detecting A Registration Mark On A Target Such As A Semiconductor Wafer" by D. E. Davis et al.

Application Ser. No. 473,585, filed Jan. 28, 1974 for "Method And Apparatus For Positioning A Beam Of Charged Particles" by M. S. Michail.

Of the prior art patents and application mentioned above, U.S. Pat. No. 3,901,814 is believed to be the one that will be of most value in terms of providing background for this invention. U.S. Pat. No. 3,901,814 describes apparatus for detecting registration marks on a wafer. The apparatus includes means for operating upon signals generated by pairs of diode detectors when electrons impinge upon the detectors. Part of the apparatus includes means for generating a signal that is related to the difference between the signals generated by the two diode detectors in a pair. Conceptually, this invention differs from the description in the patent in that the latter means are replaced by means for differentiating one or more signals and, if more than one signal is used, means for summing the signals just before or just after differentiation.

When one considers the simplicity and relatively small cost of this invention as compared with the prior art, the advantages realized with this invention are quite extraordinary ordinary. The significant advantage of this invention is that potential registration error is greatly reduced. One of the factors leading to this reduction is that registration error is directly proportional to the rise time of the registration signal. Since the rise time of the differentiated signal generated with this invention is less than the rise time of the difference signal used in the prior art, error is reduced. Also, registration error is inversely proportional to the square root of the number of edges provided by registration marks. With this invention, primarily because of the decreased rise time, edges may be located more closely together, thereby increasing the number of edges within a given area, leading to a further decrease in registration error.

The foregoing and other features and advantages of the invention will be apparent from the following more particular description of preferred embodiments of the invention as illustrated in the accompanying drawings. In the drawings.

Figure 1:
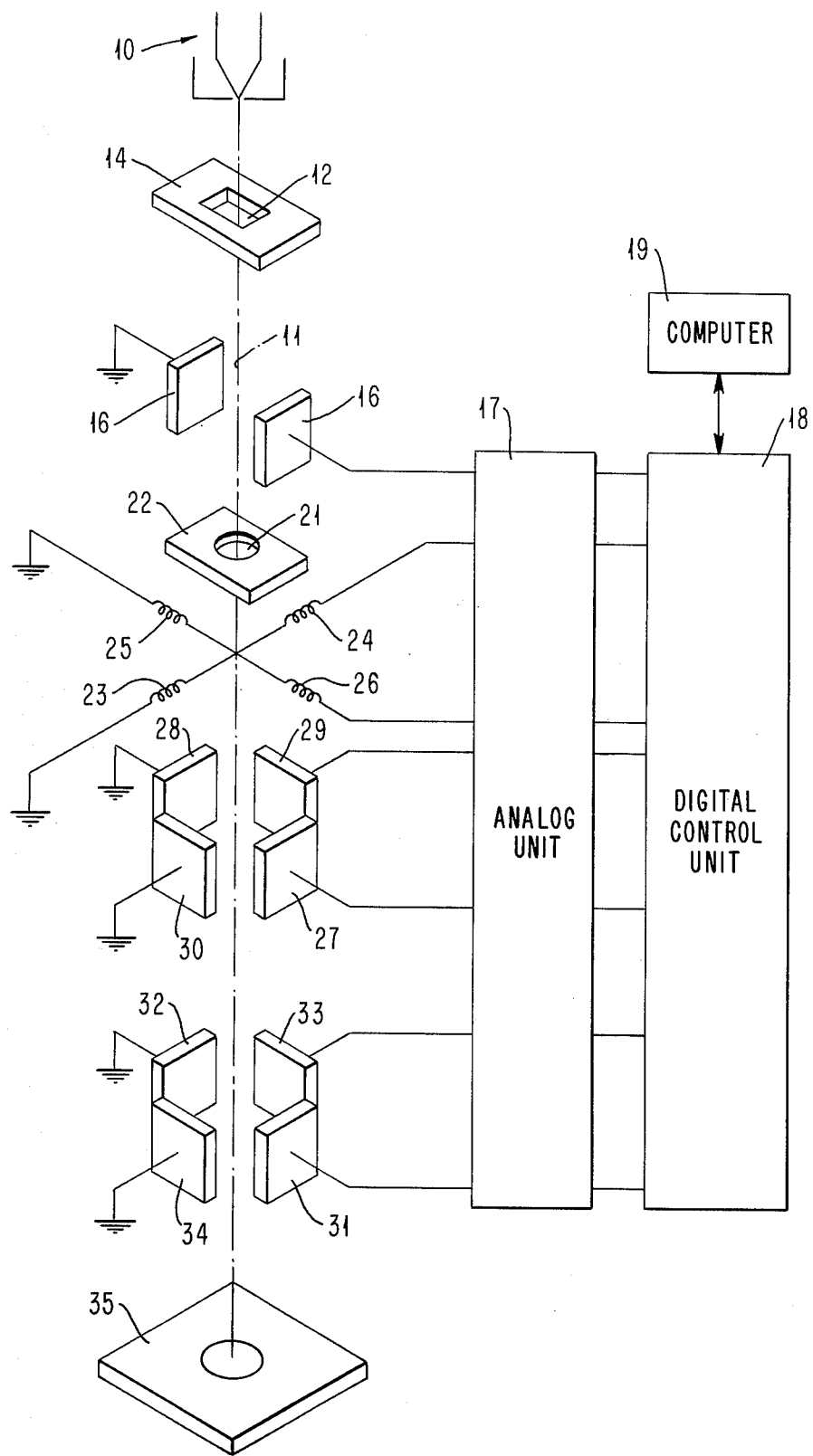
FIG. 1 is a schematic view showing an electron beam and apparatus for controlling the beam.

Referring to FIG. 1, there is shown an electron gun 10 for producing a beam 11 of charged particles in the well-known manner. The electron beam 11 is passed through an aperture 12 in a plate 14 to shape the beam 11. The beam 11 is preferably square shaped and has a size equal to the minimum line width of the pattern that is to be formed.

The beam 11 passes between a pair of blanking plates 16, which determine when the beam 11 is applied to the material and when the beam 11 is blanked. The blanking plates 16 are controlled by circuits of an analog unit 17. The analog unit 17 is controlled by a digital control unit 18 in the manner more particularly shown and described in U.S. Pat. No. 3,866,013. The digital control unit 18 is connected to a computer 10, which is preferably an IBM System/370 computer.

The beam 11 then passes through a circular aperature 21 in a plate 22. This controls the beam 11 so that only the charged particles passing through the centers of lenses (not shown) are used, producing a square-shaped spot without any distortion.

The beam 11 is next directed through magnetic deflection coils 23, 24, 25, and 26. The magnetic deflection coils 23 and 24 control the deflection of the beam 11 in a horizontal (or X) direction while the magnetic deflection coils 25 and 26 control the deflection of the beam 11 in a vertical (or Y) direction. Accordingly, the coils 23-26 cooperate to move the beam 11 in a horizontal scan by appropriately deflecting the beam. While the beam 11 could be moved in a substantially raster fashion as shown and described in U.S. Pat. No. 3,644,700 to Kruppa et al, it is preferably moved in a back and forth scan so that the beam 11 moves in opposite directions along adjacent lines as shown and described in the aforesaid Ryan and Michail et al applications. Thus, a bucking sawtooth is supplied to the coils 23 and 24 during forward scan of the type shown in FIG. 3b of the aforesaid Kruppa et al patent while a positive bucking sawtooth, which is of opposite polarity to the sawtooth shown in FIG. 3b of the aforesaid Kruppa et al patent, is supplied to the coils 23 and 24 during the backward scan.

The beam 11 then passes between a first set of electrostatic deflection plates 27, 28, 29, and 30. The electrostatic deflection plates 27 and 28 cooperate to deflect the beam in a horizontal (or X) direction while the electrostatic deflection plates 29 and 30 cooperate to move the beam 11 in a vertical (or Y) direction. The plates 27-30 are employed to provide any desired offset of the beam 11 at each of the predetermined positions or spots to which it is moved. Linear correction signals are supplied to the coils 23-26.

After passing between the electrostatic deflection plates 27-30, the beam 11 then passes between a second set of electrostatic deflection plates 31, 32, 33, and 34. The electrostatic deflection plates 31 and 32 cooperate to deflect the beam 11 in the X direction while the electrostatic deflection plates 33 and 34 cooperate to move the beam 11 in the Y direction. The plates 31-34 are employed to shift the beam 11, as more particularly shown and described in the aforesaid Michail et al application, at each of the predetermined positions to which the beam 11 is moved to move the beam 11 from the predetermined position to the actual deviated position at which the beam 11 must be applied to fit the pattern within the actual field.

The beam 11 is then applied to a target, which is supported on a table 35. The table 35 is movable in the X and Y direction as more particularly shown and described in the aforesaid Kruppa et al patent.

The beam 11 is moved through A, B, and C cycles as shown and described in the aforesaid Kruppa et al patent. The present invention is concerned with processing the signals during the A cycle of the beam 11 to detect the location of each of the registration marks.

Figure 2:
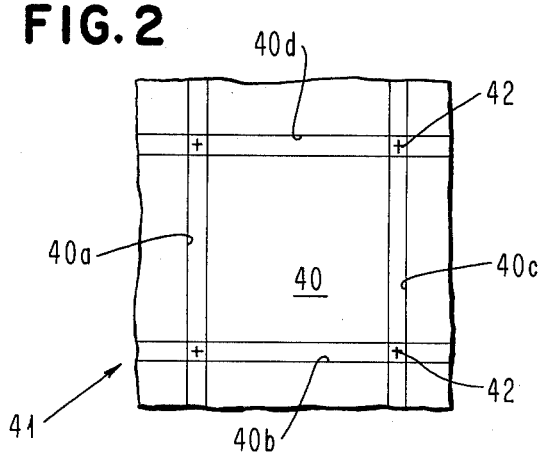
FIG. 2 is a top plan view of a portion of a semiconductor wafer having areas to which the beam is to be applied.

As shown in FIG. 2, the target may comprise a plurality of overlapping fields 40. The one complete field 40 that is shown is formed within the bounds of lines 40a, 40b, 40c and 40d. There is a plurality of the fields 40 on a semiconductor wafer 41 with each of the fields 40 having resist to be exposed by the beam 11.

There is a registration mark 42 (schematically shown as a cross in FIG. 2) at each of the four corners of each of the fields 40. As shown in FIG. 2, the overlapping of the adjacent fields 40 results in the same registration mark 42 being utilized for each of four different fields 40. Thus, the registration mark 42 in the lower right corner of the only complete field 40 shown in FIG. 2 also is the registration mark in the lower left corner for the field 40 to the right of the complete field, the upper right corner of the field below the complete field 40, and the upper left corner of the field which is diagonally down to the right of the complete field 40. Of course, non-overlapping fields, each having its own complete set of registration marks could also be used.

Figure 3:
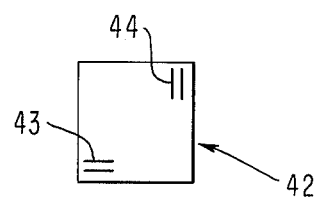
FIG. 3 is an enlarged top plan view of a registration mark that is to be detected.

Each of the registration marks 42 is preferably formed of a plurality of horizontally extending bars 43, being, for example, two in number as shown in FIG. 3, and a plurality of vertically extending bars 44, preferably equal in number to the number of bars 43. Any other suitable arrangement of the registration mark 42 can be employed in which there can be scans of vertical edges of the mark in the X direction and horizontal edges of the mark in the Y direction.

As explained in the aforesaid Michail et al application, the registration mark 42 at each of the four corners is used to locate the field 40 in which writing of the pattern is to occur. The exact location of each of the registration marks 42 is obtained through passing the electron beam 11 over the vertical edges of the vertically disposed bars 44 of the mark 42 during scans in the X (horizontal) direction and over the horizontal edges of the horizontally disposed bars 43 of the mark 42 during scans in the Y (vertical) direction. A registration detector is employed to detect when the electron beam 11 passes over each of the edges of the registration mark 42.

Figure 4:
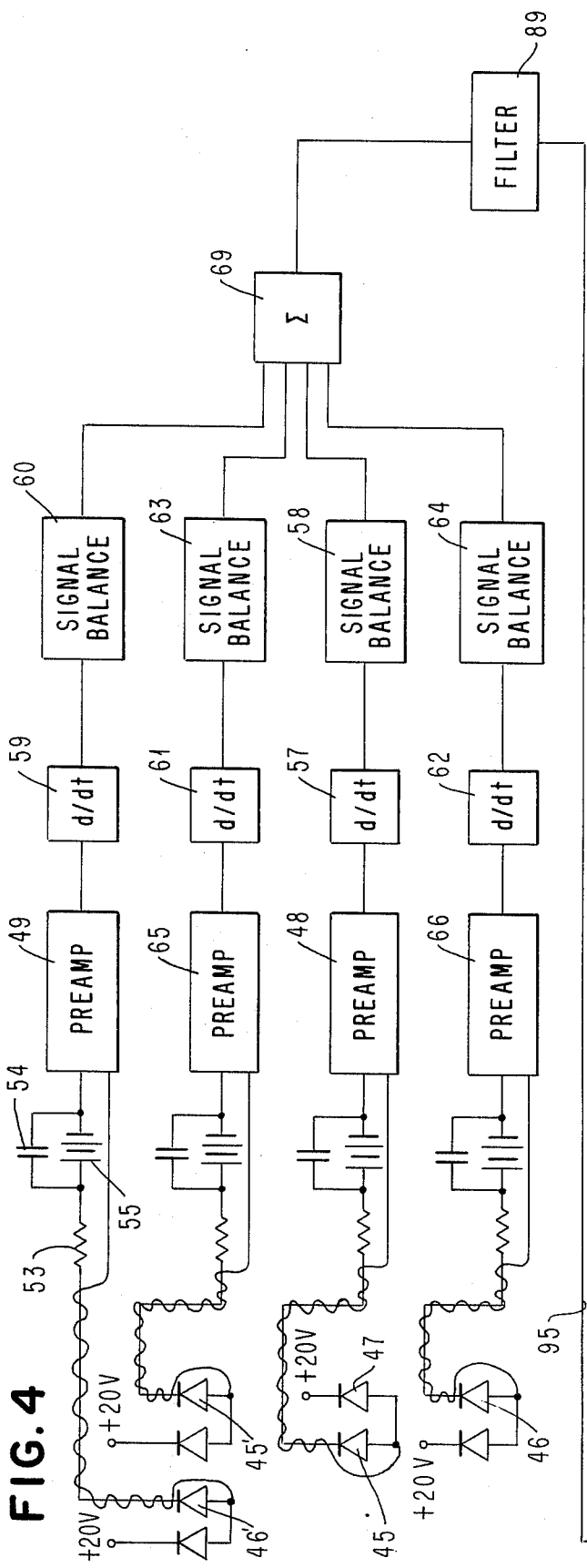
FIG. 4 is a schematic block diagram of a circuit arrangement for processing the signals for detecting a registration mark.
Figure 4:
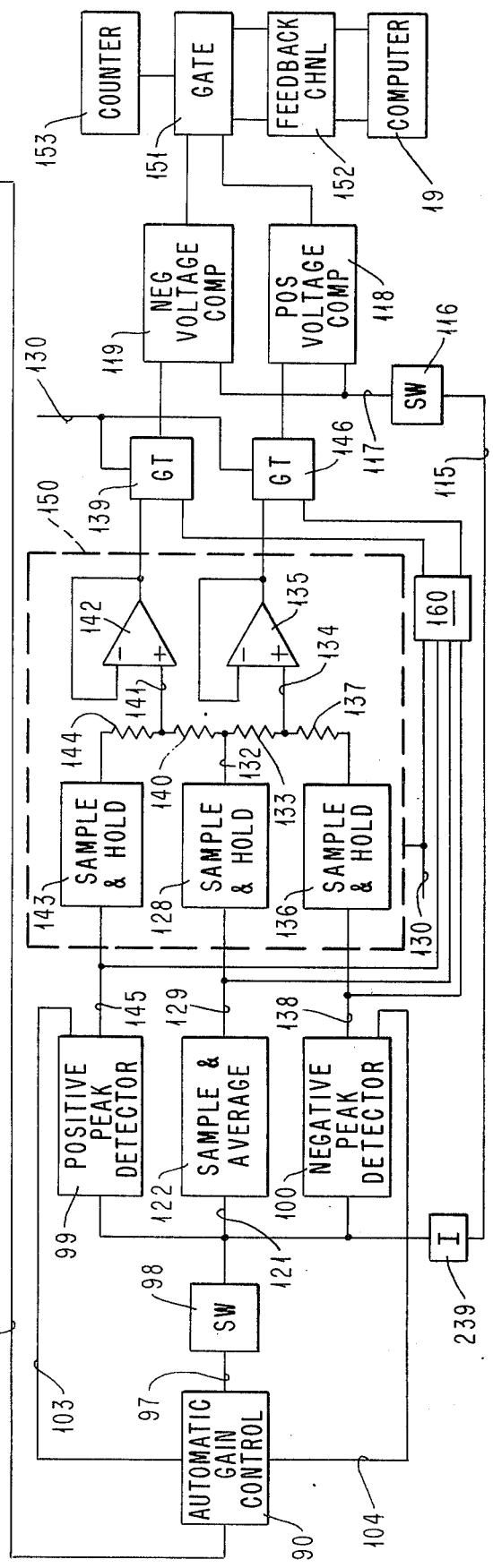

As shown in FIG. 4, the registration detector preferably includes four diodes 45, 46, 45' and 46' disposed above the semiconductor wafer 41 and having an opening formed therebetween through which the beam 11 passes to impinge upon a portion of the semiconductor wafer 41. The four diodes 45, 46, 45' and 46' are preferably arranged in quadrants as shown in FIG. 4.

During an X scan, the backscatter of the electrons from the semiconductor wafer 41 changes when the beam 11 passes over one of the vertical edges of one of the bars 44 of the registration mark 42. Each of the bars 43 and 44 of the registration mark 42 is formed either by a depression or by a raised portion in the surface of the wafer 41.

The detecting diodes 45, 46, 45' and 46' are fully depleted, and each of the diodes 45, 46, 45' and 46' has a second diode 47, which functions as a guard ring. The detecting diodes 45, 46, 45' and 46' are turned with their junction side away from the beam 11 for protection. Each of the detecting diodes 45, 46, 45' and 46' is biased so that the side turned toward the beam 11 is at ground potential in order to not deflect the beam 11.

As shown in FIG. 4, the detecting diodes 45, 46, 45' and 46' are connected to preamplifiers 48, 49, 65 and 66, respectively. Each of the preamplifiers 48, 49, 65 and 66 includes an operational amplifier having a capacitor and a resistor connected in parallel to form a feedback and to control the gain and bandwidth of the preamplifier.

The anode of each detecting diode is connected to the negative input of the operational amplifier through a resistor 53, and a capacitor 54 which is in parallel with a battery 55. The diode 47, which functions as a guard ring, is connected to a positive voltage source, which has a slightly smaller potential than the battery 55.

Each of the diodes is connected to the positive input of the operational amplifier of the preamplifier and ground through a wire which is wrapped around the wire between the cathode of the diode and the resistor 53. This wrapping of the wire suppresses noise.

The output of each preamplifier 48, 49, 65 and 66 is connected to a differentiating circuit 57, 59, 61 and 62, respectively. The outputs of the differentiators 57, 59, 61 and 62 are connected to signal balancing means 58, 60, 63 and 64, respectively. As is described in Pat. 3,901,814, the signal balancing means (each including a multiplying analog to digital converter, or MDAC) are utilized to automatically balance the signals in accordance with the location of a mark 42 relative to each of the detecting diodes 45, 46, 45' and 46'.

The signal balancing means 58, 60, 63 and 64 are connected to a summing circuit 69, which adds the signals from the differentiators 57, 59, 61 and 62.

The output of the summing circuit 69 is fed through a filter 89 to an automatic gain control 90. The automatic gain control 90 controls the gain factor in accordance with the size of the step (up or down) of the registration mark and with the material of the portion of the wafer 41 having the mark 42 over which the beam 11 is scanning. The gain factor is obtained during a first scan of the beam 11 over the portion of the wafer 41 having the mark 42 and used throughout the remainder of the scans over the same mark 43 or 44. The automatic gain control 90 adjusts the signal on the subsequent scans to the predetermined amplitude in accordance with that determined during the first scan as defined by the gain factor.

The output of the automatic gain control 90 is applied to an electronic switch 98, which is closed when the beam 11 is on and the signal from the mark is expected, otherwise it is open. The closing of the electronic switch 98 allows the output of the automatic gain control 90 to be supplied to a positive peak detector 99 and a negative peak detector 100. The output of the positive peak detector 99 is supplied to the automatic gain control 90 by a line 103. The output of the negative peak detector 100 is supplied to the automatic gain control 90 by a line 104.

As is described in U.S. Pat. No. 3,901,814, the gain factor for the automatic gain conrol 90 during, for example, all of the scans in the X direction over one of the marks 42, is set during the first scan in the X direction.

It will be understood that the automatic gain control 90 is set again during the first scan when the beam 11 is moved in the Y direction. Similarly, when the beam 11 is moved to another of the marks 42, the automatic gain control 90 again has its gain factor set, first for the X scans and then for the Y scans.

In addition to the output of the automatic gain control 90 being supplied to the positive peak detector 99 and the negative peak detector 100 when the electronic switch 98 is closed, the inverted output of the automatic gain control 90 also is supplied over a line 115 when the electronic switch 98 is closed. The line 115 connects through an electronic switch 116 and a line 117 to a positive voltage comparator 118 and a negative voltage comparator 119. The electronic switch 116 is opened during the first scan, so comparators 118 and 119 cannot receive any input during the first scan (mark 42 is not being located at that time).

The output of the automatic gain control 90 also is connected through a line 121 to a sample and average circuit 122. Whenever the electronic switch 98 is closed, the output of the automatic gain control 90 is transmitted over the line 121 to the sample and average circuit 122 during all scans when the beam 11 is on.

With the exception of the automatic gain control, each portion of FIG. 4 described above is utilized during both forward and backward sweeps of the beam. Subsequent processing of position data requires separate circuitry for sweeps in the two directions. Broken line 150 encloses circuitry related to sweeps in one (e.g. the forward) direction and block 160 represents circuitry related to sweeps in the other (e.g. reverse) direction. Although details are shown only for block 150, it will be recognized that blocks 150 and 160 are identical.

In order to switch between blocks 150 and 160, gating signals are provided on forward/reverse line 130. These gating signals will control gates (not shown) within blocks 150 and 160 in the well known manner. The gating signals on line 130 also control gates 139 and 146 at the outputs of blocks 150 and 160. The following description applies to the circuitry within block 150 during sweeps in one direction. It is equally applicable to block 160 during sweeps in the other direction. In the following description of block 150, it will be understood that the term "next scan" refers to the next scan in the same direction.

The output of the sample and average circuit is supplied to a sample and hold circuit 128 through a line 129. When the electronic switch 98 is opened to stop the supply of the output voltage of the automatic gain control 90 to the sample and average circuit 122, an electronic switch (not shown) is closed to gate the sample and hold circuit 128 so that it can receive the average signal from the scan in the sample and average circuit 122. Thus, at the end of the portion of each scan in which the beam 11 is turned off, the sample and hold circuit 128 receives the average voltage from the sample and average circuit 122. The output of the sample and hold circuit 128 is used during the next scan of the beam 11 in the same direction.

When the electronic switch is opened to stop transfer from the sample and average circuit 122 to the sample and hold circuit 128, another electronic switch is closed to remove the average voltage of the sample and average circuit 122 from the scan before the next scan starts. The latter electronic switch opens at the start of the next scan when the beam 11 turns on; this also is before the electronic switch 98 closes to again supply the voltage from the automatic gain control 90 to the sample and average circuit 122.

The output of the sample and hold circuit 128 for the sample and average circuit 122 provides the residual baseline voltage on its output line 132. The output line 132 of the sample and hold circuit 128 is connected through a resistor 133 to an input line 134 of a buffer amplifier 135.

The other input to the input line 134 is from a sample and hold circuit 136 through a resistor 137. The sample and hold circuit 136 is connected by a line 138 to the output of the negative peak detector 100. Thus, the output of the buffer amplifier 135 to the positive voltage comparator 118, through gate 146, provides a reference threshold signal for the positive voltage comparator 118.

The positive threshold signal is a voltage between the residual baseline voltage from the sample and hold circuit 128 and the peak voltage from the sample and hold circuit 136 with the resistances of the resistors 133 and 137 determining the magnitude of the positive threshold signal. The resistances of the resistors 133 and 137 are preferably equal so that the positive threshold voltage is half way between the outputs of the sample and hold circuit 128 and of the sample and hold circuit 136.

The sample and hold circuit 136 receives the output of the negative peak detector 100 on the line 138 when a signal on line 130 gates the sample and hold circuit 136. This is when the beam 11 is turned off at the end of the scan.

The output line 132 of the sample and hold circuit 128 also is connected through a resistor 140 to an input line 141 of a buffer amplifier 142. The input line 141 of the buffer amplifier 142 also is connected to a sample and hold circuit 143, through a resistor 144. The sample and hold circuit 143 is connected by a line 145 to the output of the positive peak detector 99.

The sample and hold circuit 143 is also gated by a signal on line 130 when the beam 11 is turned off at the end of the scan. The output of the sample and hold circuit 143 for the positive peak detector 99 and the output of the sample and hold circuit 128 of the sample and average circuit 122 are supplied through the buffer amplifier 142 to provide, through gate 139, the reference threshold voltage for the negative voltage comparator 119.

The negative threshold signal is a voltage between the residual baseline voltage from the sample and hold circuit 128 and the peak voltage from the sample and hold circuit 143 with the resistances of the resistors 140 and 144 determining the magnitude of the negative threshold signal. The resistances of the resistors 140 and 144 are preferably equal so that the negative threshold voltage is half way between the outputs of the sample and hold circuit 128 and of the sample and hold circuit 143.

Accordingly, the threshold voltages for the comparators 118 and 119 are obtained at the end of a scan by the beam 11 and then used as the threshold voltages during the next scan in the same direction. Thus, the threshold voltages for the comparators 118 and 119 are changed at the end of each scan so that the threshold voltages are those obtained from the prior scan in the same direction.

Each time that there is an output pulse from the comparator 118 or the comparator 119, it is supplied through a gate 151 to a feedback channel 152 of the digital control unit 18. A counter 153 supplies clock pulses through the gate 151, when it is activated by a signal from the comparator 118 or 119, to the feedback channel 152 of the digital control unit 18 so that each of the edges of each of the vertical bars 44 can be ascertained by the computer 19. Thus, both positive and negative edges of each of the vertical bars 44 of the registration mark 42 are supplied to the logic of the feedback channel 152 so that proper location of the mark 42 is rapidly determined. The identity of the positive and negative edges is also passed to the computer to aid in discriminating the mark data from noise.

Considering the operation of the present invention, it will be assumed that the beam 11 is making X scans with the first X scan being in the +X direction. Just prior to the start of the first X scan, the electronic switch of the sample and average circuit 122 and the electronic switch of each of the positive peak detector 99 and the negative peak detector 100 were closed. As a result, the stored signals in the sample and average circuit 122, the positive peak detector 99, and the negative peak detector 100 are removed prior to the start of the first scan. Thus, the positive peak detector 99, the negative peak detector 100, and the sample and average circuit 122 are ready to receive information during the first X scan.

At the time that the beam 11 is turned on to begin the first X scan across the registration mark 42 of the semiconductor wafer 41, the electronic switch of the sample and average circuit 122 and the electronic switch of each of the positive peak detector 99 and the negative peak detector 100 are opened. This enables the positive peak detector 99, the negative peak detector 100, and the sample and average circuit 122 to again receive signals for storing.

At the time that the beam 11 begins the first X scan, the signals from the detecting diodes 45, 46, 45' and 46' are transmitted to differentiators 58, 60, 63 and 64, respectively.

Just after the beginning of the first scan, the electronic switch 98 is closed. The electronic switch 116 is opened at the start of the first scan. The closing of the electronic switch 98 enables the output of the automatic gain control 90 to be supplied to the positive peak detector 99, the negative peak detector 100, and the sample and average circuit 122. The opening of the electronic switch 166 disconnects the comparators 118 and 119 from the output of the automatic gain control 90.

Thus, as the beam 11 makes its first X scan, the output from the summer 69 is supplied through the automatic gain control 90 to the positive peak detector 99, the negative peak detector 100, and the sample and average circuit 122 but not to the comparators 118 and 119. The outputs of the positive peak detector 99 and the negative peak detector 100 are supplied to the automatic gain control 90 just after the first X scan for use in obtaining the gain factor for the remainder of the X scans. (The closing of the switch 116 connects the output of the automatic gain control 90 to each of the comparators 118 and 119 throughout the remainder of the X scans over the registration mark 42 being scanned whenever the electronic switch 98 is closed).

When the beam 11 is turned off after the first X scan, a signal on line 130 gates on the sample and hold circuits 128, 136 and 143. This information is transferred to the comparators 118 and 119 but is not utilized since there is no supply through the line 117 from the automatic gain control 90 during the first scan since the electronic switch 116 was open.

After gating the sample and hold circuits 128, 136, and 143, the signal on line 130 falls with the beam 11 still in its first X scan but the beam 11 turned off. When the signal falls, electronic switches (not shown) are closed to discharge the sample and average circuit 122 and each of the positive peak detector 99 and the negative peak detector 100.

The latter electronic switches are opened at the time that the beam 11 reverses its direction of scan and is turned on. Thus, the positive peak detector 99, the negative peak detector 100, and the sample and average circuit 122 receive the information from the second X scan since the electronic switch 98 also is closed at this same time.

During the second X scan, the positive peak detector 99 stores the maximum positive peak signal, the negative peak detector 100 stores the negative peak signal, and the sample and average circuit 122 obtains an average of the signal from the automatic gain control 90.

During this scan, the electronic switch 116 is closed since it has remained closed from the the time that the beam 11 was turned off during the first X scan and remains closed throughout the remainder of the X scans over the registration mark 42. Thus, the positive voltage comparator 118 and the negative voltage comparator 119 continue to receive the output of the automatic gain control 90 whenever the electronic switch 98 is closed.

However, it is not until the second X scan that the automatic gain control 90 has the desired gain factor for the portion of the wafer 41 having the registration mark 42 being scanned. Therefore, when the beam 11 is turned off during the second and subsequent X scans there can be outputs from the positive peak detector 99, the negative peak detector 100, and the sample and average circuit 122 for use with the comparators 118 and 119 to provide the threshold voltages therein.

It should be understood that the output pulses from the comparators 118 and 119 are not effective during the second and third scans. The digital control unit 18 prevents the information from being utilized during the second and third X scans. It is not until the fourth X scan that the information from the outputs of the comparators 118 and 119 is utilized to locate the edges of each of the vertical bars 44 of the mark 42.

During the second X scan, the positive peak detector 99 detects the positive peak signal from the automatic gain control 90 and the negative peak detector 100 detects the negative peak signal from the automatic gain control 90. The sample and average circuit 122 averages the output from the automatic gain control 90.

When the beam 11 is turned off during the second X scan, a signal on line 130 gates the sample and hold circuits 128, 136 and 143, respectively. Thus, the sample and hold circuit 128 will contain the average voltage from the second X scan throughout the third and fourth scans and supply it over the line 132 to the buffer amplifiers 135 and 142 during the fourth scan. The sample and hold circuit 136 will maintain a positive pulse, which is indicative of the negative peak signal during the second scan, throughout the fourth scan.

The sample and hold circuit 143 produces a negative output, which is indicative of the positive peak voltage during the second X scan, throughout the fourth scan.

Therefore, the positive voltage comparator 118 has a threshold voltage during the fourth X scan correlated to the residual baseline voltage and the inverted negative peak voltage during the second scan. The comparator 118 has the same threshold voltage throughout the fourth scan.

Similarly, the negative voltage comparator 119 has a threshold voltage during the fourth scan correlated to the residual baseline voltage and the inverted positive peak signal during the second scan. The comparator 119 has the same threshold voltage throughout the fourth scan.

During the second scan with the beam 11 turned off, the signal on line 130 is raised about half way through the length of time that the beam 11 is blanked off during the second scan. When the signal is raised, electronic switches are closed to remove the residual baseline voltage from the sample and average circuit 122 and to remove the stored peak signal from each of the positive peak detector 99 and the negative peak detector 100.

The latter electronic switches are opened when the beam 11 is turned on to start the third scan, so the positive peak detector 99, the negative peak detector 100, and the sample and average circuit 122 again receive the output of the automatic gain control 90 during the third X scan.

Just after the start of the third scan by the beam 11, the switch 98 also closes to again allow the automatic gain control 90 to supply the output from the diodes 45, 46, 45' and 46'.

In each of the X scans after the third scan, the positive voltage comparator 118 produces an output when its threshold voltage is crossed by the input on the line 117 from the automatic gain control 90 through the inverter 239. This causes gate 151 to allow the clock pulse from the counter 153 to be supplied to the feedback channel 152. As a result, the location of each of the positive peak signals can be determined by the computer 19.

In a similar manner, the negative voltage comparator 119 supplies an output pulse during each scan after the third scan. The output pulse from the negative voltage comparator 119 is produced when the negative threshold voltage is crossed by the inverted output from the automatic gain control 90. The output pulse from the negative voltage comparator 119 enables the computer 19 to again determine the location of the negative peak signal.

The twenty-seven scans for the registration mark 42 in the X direction after the first three scans are employed to insure averaging of the location of the registration mark 42. This reduces the percent of error to a satisfactory minimum.

After the beam 11 completes its thirty scans with the reversal of the beam 11 after each scan, the beam 11 scans in the Y direction over the same registration mark 42 to ascertain the location of each of the edges of each of the horizontal bars 43 of the mark 42.

When the beam 11 is to scan in the Y direction, the digital control unit 18 supplies different multiplying coefficients to the MDAC of each of the signal balancing means 58, 60, 63 and 64. The remainder of the operation in the Y scans would be the same as that in the X scans.

With the information in the feedback channel 152 as to the location of the registration mark 42 with respect to its desired location, the location of the field 40 can be determined by the four registration marks 42 at the four corners of the field 40 as more particularly shown and described in the aforementioned Michail et al application.

Among the changes and variations that can be made in this invention, as compared to the preferred embodiment described above, three are of particular interest.

The first variation concerns the number of detectors used for sensing backscattered charged particles. Although a preferred embodiment uses several detectors and sums the signals just before or just after differentiating, good results could be obtained by using a signal from a single appropriately positioned detector and differentiating the signal. (Although not quite as precise as the preferred embodiment, this variation is better than the prior art subtraction apparatus mentioned above.) In order to obtain appropriate positioning of the detector, a preferred embodiment of this variation could utilize a plurality of detectors which could be located, for example, as described above in connection with FIG. 4. The outputs of the detectors would be fed to a switching mechanism which would be used to select the appropriate detector output (depending upon the portion of the chip being scanned) for transmission to a single differentiator. As compared with the preferred embodiment, this variation would add the complexity of a switching mechanism (which would utilize well known implementation techniques similar, for example, to those described in U.S. Pat. No. 3,901,814) but it would eliminate the need for: a summer; signal balancers; all but one of the differentiators; and all but one of the preamplifiers.

In another embodiment of this first variation, complexity could be further reduced by using only one detector, thus eliminating the need for switching apparatus. The single diode detector would preferably be somewhat spherical or circular in shape so as to be able to detect a reasonably large portion of the backscattered particles. However, the single detector could be shaped and located to respond to particles scattered in two orthogonal directions. That is, the diode detector could be curved or angled so that it responds to backscattered particles in essentially the same manner as would diodes 45 and 45' or 46 or 46' shown in FIG. 4. Although a single diode detector covering a still smaller area could be used, that would generally result in an unnecessary loss of precision and is not recommended.

The second variation concerns the sequence of differentiating and summing when more than one detector is used. Although the preferred embodiment utilizes differentiators prior to the summer, the reverse sequence (that is, summation followed by differentiation) could also be used. In some situations, this reversal of sequence might result in a more economical implementation because only a single differentiator would be needed, instead of the four that are shown in FIG. 4. However it should be noted that the sequence shown in FIG. 4 provides the advantage that the differentiators remove the dc background level before the signals are summed. For this reason, it is preferred that the differentiators precede the summer.

Figure 6:
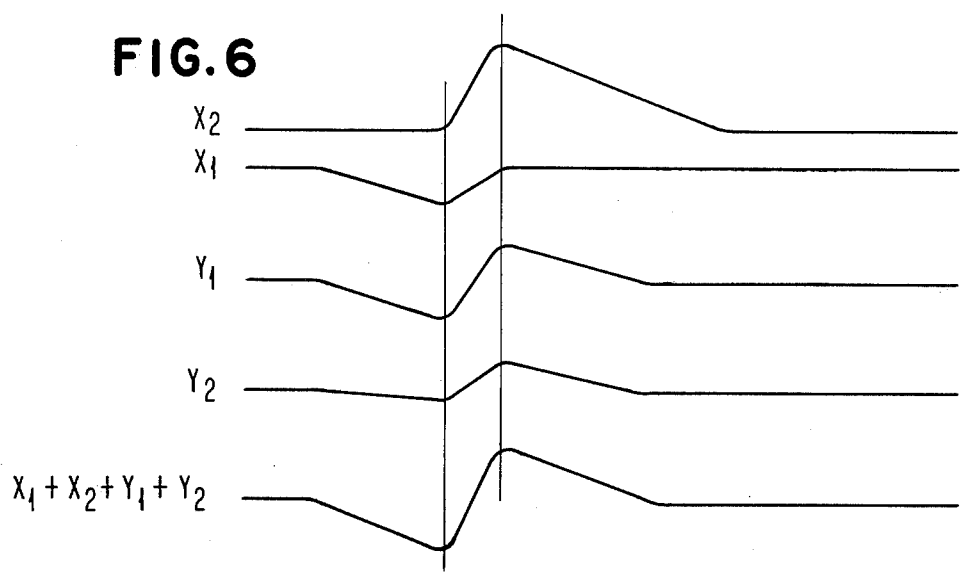
FIG. 6 shows relative shapes and magnitudes of signals sensed at an edge of four detectors, and the sum of the signals.

FIG. 6 shows some of the signals that would be generated within the circuitry of FIG. 4 if summing preceded differentiation. Waveforms X1, X2, Y1 and Y2 are drawn to relative scale with respect to each other and represent the outputs of detectors 45, 46, 45' and 46' respectively. The fifth waveform is the sum of the X1, X2, Y1 and Y2 signals and represents the output of a summer such as 69. This sum signal exhibits a very steep rise, and therefore a short rise time. This short rise time lends to decreased registration position error and will also permit an increase in the density of registration marks, leading to a still further decrease in registration error.

The other major variation, which could be utilized alone or in combination with the preceding alternative, concerns the choice of using the outputs of all four detecting diodes 45, 46, 45' and 46' simultaneously or of using one pair, 45 and 46 or 45' and 46', at a time. As is described in U.S. Pat. No. 3,901,814 it is common practice in the prior art to utilize one pair of diodes for detection while scanning in the X direction and to use the other pair while scanning in the Y direction. There is no need to provide a detailed description herein of this variation of the invention because the details of such an implementation would be quite clear to those skilled in the art, in light of the above descriptions and various background knowledge (such as, for example, U.S. Pat. No. 3,901,814).

Among the reasons for preferring to utilize the four diode detectors simultaneously, perhaps the most obvious is that the preferred implementation is simpler because there is no need for circuitry dedicated to switching one pair of detectors into the system while the other pair is switched out. But another, unobvious, reason for preferring to use all four detectors is that, when using this invention, a steeper signal is produced when four detectors are used than when only two are used.

Figure 5:
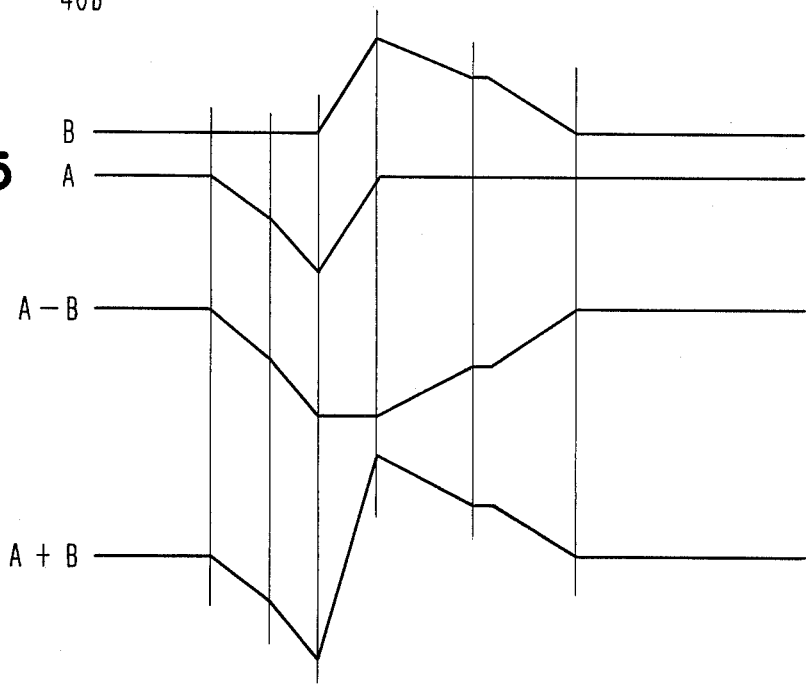
FIG. 5 shows the relative shapes and magnitudes of signals sensed by a pair of diode detectors and of their difference and their sum.

Consideration of the latter variation of the invention can be helpful in comparing it to the prior art. FIG. 5 shows some of the signals that are of significance in this invention. The signals shown in FIG. 5 are drawn to relative scale with respect to each other without regard to dc background levels. The signals labeled A and B exemplify the two signals that would be generated by a pair of diode detectors such as 45 and 46 or 45' and 46' shown in FIG. 4 as the electron beam approaches one edge of a registration mark. Those skilled in the art will recognize that FIG. 5 exemplifies signals generated at one edge (for example, a positive going step in the resist-covered surface) of a registration mark, and that the signals generated at the other edge (for example, a negative going step) of the mark will be substantially identical but opposite in polarity. The third signal shown in FIG. 5 represents the difference between signals A and B and is the signal that would be generated by a differential amplifier that received its inputs from the signal balancing means 58 and 60 as is shown in FIG. 2 of U.S. Pat. No. 3,901,814. The fourth signal shown in FIG. 5 is the sum of signals A and B and represents the signal generated by summing means (such as 69 shown in FIG. 4 herein) that received inputs from one diode pair. It will be noted that this latter signal exhibits a very steep rise (and, of course, would exhibit a very steep fall at the other edge of the mark) which enables the apparatus to quite precisely locate the edge of a registration mark on the wafer. This short rise time will decrease registration error, as explained in the introductory portion of this specification, and also will enable a greater concentration of registration marks which will lead to a further reduction in registration error, as also explained in said introductory portion. For ease of detection, and enhanced signal-to-noise ratio, this latter signal is fed to a bandwidth limited differentiator (either before or after the summation) as described above. The idealized signals shown in this figure illustrate our discovery that a single signal will have a shorter rise time than the difference signals utilized in the prior art. FIGS. 5 and 6 also show that the sum of the signals rises even more sharply than any of the individual signals, thus further enhancing the ability of the system to detect registration marks.

It should be understood that the beam 11 requires the use of a focus grid and a calibration grid in the same manner as described in the aforesaid Kruppa et al patent. One suitable example of these grids is the focus and calibration grids of the aforesaid Kruppa et al patent.

While each of the registration marks 42 has been described as having the bars 43 and 44 formed as depressions, it should be understood that the bars 43 and 44 could be formed otherwise as long as they produced a signal when the beam 11 passed over each edge thereof. For example, each of the bars 43 and 44 could be a raised portion. If the marks are of a different material from the wafer surface surrounding them, they need not necessarily be raised or lowered with respect to the surrounding surface. Many other ways of implementing the marks (such as, for example, the use of a single dot of material with a different backscatter coefficient from the surrounding wafer) could be used.

While the threshold voltages have been disclosed as being used from the prior scan in the same direction, it should be understood that the threshold voltage could be utilized from the prior scan in the opposite direction. This would necessitate the output signal of the automatic gain control 90 being inverted as described in U.S. Pat. No. 3,901,814.

While the present invention has shown and described the beam 11 as having its direction reversed during each scan, it should be understood that such is not necessary for operation of the present invention. For example, the beam 11 could scan in only one direction as shown and described in the aforesaid Kruppa et al patent, it could scan in a spiral, etc. However, scanning in only one direction would reduce the speed of operation and would require certain changes in the circuitry. For example, the positive peak detector 99 and the negative peak detector 100 would have to be designed to not have their output signals inverted.

While the invention has been particularly shown and described with reference to preferred embodiments thereof, it will be understood by those skilled in the art that the above and other changes in form and details may be made therein without departing from the spirit and scope of the invention.

What is claimed is:

1. In apparatus for detecting the location of an electron beam with respect to registration marks on a wafer, said apparatus including: means for causing an electron beam to scan said registration marks, a plurality of detecting means each for detecting electrons scattered by said registration marks and for producing a first signal related to the time varying density of scattered electrons impinging on the detecting means, and analyzing means for analyzing data to provide an indication of said location; the improvement comprising:

circuit means having an output and being responsive to said detecting means for producing a second signal at said output representing the time derivative of the sum of at least two of said first signals;

said output being connected to said analyzing means to provide said second signal as data to said analyzing means.

2. The improved detecting apparatus of claim 1 wherein said circuit means comprises:

at least two differentiating means, each responsive to one of said first signals to produce a third signal representing the time derivative of said one of said first signals; and summing means responsive to said third signals for summing said third signals to produce said second signal.

3. The improved detecting apparatus of claim 1 including four detecting means and wherein:

said circuit means is responsive to four of said first signals; and wherein two of said four first signals are related to the density of electrons scattered in a direction substantially parallel to the direction of electron beam scan; and the other two of said four signals are related to the density of electrons scattered in a direction substantially orthogonal to said direction of electron beam scan.

4. The improved detecting apparatus of claim 3 wherein said circuit means comprises:

four differentiating means, each responsive to one of said first signals to produce a third signal representing the time derivative of said one of said first signals; and summing means responsive to said third signals for summing said third signals to produce said second signal.

5. The improved detecting apparatus of claim 1 including four detecting means and wherein:

said circuit means is responsive to four of said first signals; and wherein two of said four first signals are related to the density of electrons scattered in a first positive and negative direction; and the other two of said four first signals are related to the density of electrons scattered in a second positive and negative direction different from said first direction.

6. The improved detecting apparatus of claim 5 wherein said circuit means comprises:

four differentiating means, each responsive to one of said first signals to produce a third signal representing the time derivative of said one of said first signals; and summing means responsive to said third signals for summing said third signals to produce said second signal.

7. In apparatus for detecting the location of an electron beam with respect to registration marks on a wafer, said apparatus including: means for causing an electron beam to scan said registration marks, detecting means for detecting electrons scattered by said registration marks and for producing a first signal related to the time varying density of scattered electrons impinging on the detecting means, and analyzing means for analyzing data to provide an indication of said location; the improvement comprising:

differentiating means having an output and being responsive to said detecting means for producing a second signal at said output representing the time derivative of said first signal;

said output being connected to said analyzing means to provide said second signal as data to said analyzing means.

* * * * *